United States Patent [19]

Tsang et al.

[11] Patent Number: 4,563,765
[45] Date of Patent: Jan. 7, 1986

[54] INTRA-CAVITY LOSS-MODULATED DIODE LASER

[75] Inventors: Dean Z. Tsang, Waltham; James N. Walpole, Concord, both of Mass.

[73] Assignee: Massachusetts Institute of Technology, Cambridge, Mass.

[21] Appl. No.: 629,639

[22] Filed: Jul. 11, 1984

Related U.S. Application Data

[63] Continuation of Ser. No. 344,144, Jan. 29, 1982, abandoned.

[51] Int. Cl.⁴ .............................................. H01S 3/19
[52] U.S. Cl. ........................................ 372/50; 372/26
[58] Field of Search ........................ 372/44, 50, 26, 28

[56] References Cited

PUBLICATIONS

Tsang et al., "Intracavity Loss Modulation of GaInAsP Diode Lasers", *Appl. Phys. Lett.* 38(3), Feb. 1, 1981, pp. 120-122.

Tsang et al., "Intracavity-Loss-Modulated GaInAsP Diode Lasers", *IEEE Transactions on Electron Devices*, vol. ED-27, No. 11, Nov. 1980, p. 2192.

Primary Examiner—James W. Davie
Attorney, Agent, or Firm—James E. Maslow; Thomas J. Engellenner

[57] ABSTRACT

An amplitude-modulated diode laser, fabricated from a double heterostructure wafer, having a passive central layer which is partially doped to permit amplification. Losses are modulated in another section of the wafer, electrically isolated from the doped amplifying section, by reverse biasing a P-N junction also formed by doping.

6 Claims, 1 Drawing Figure

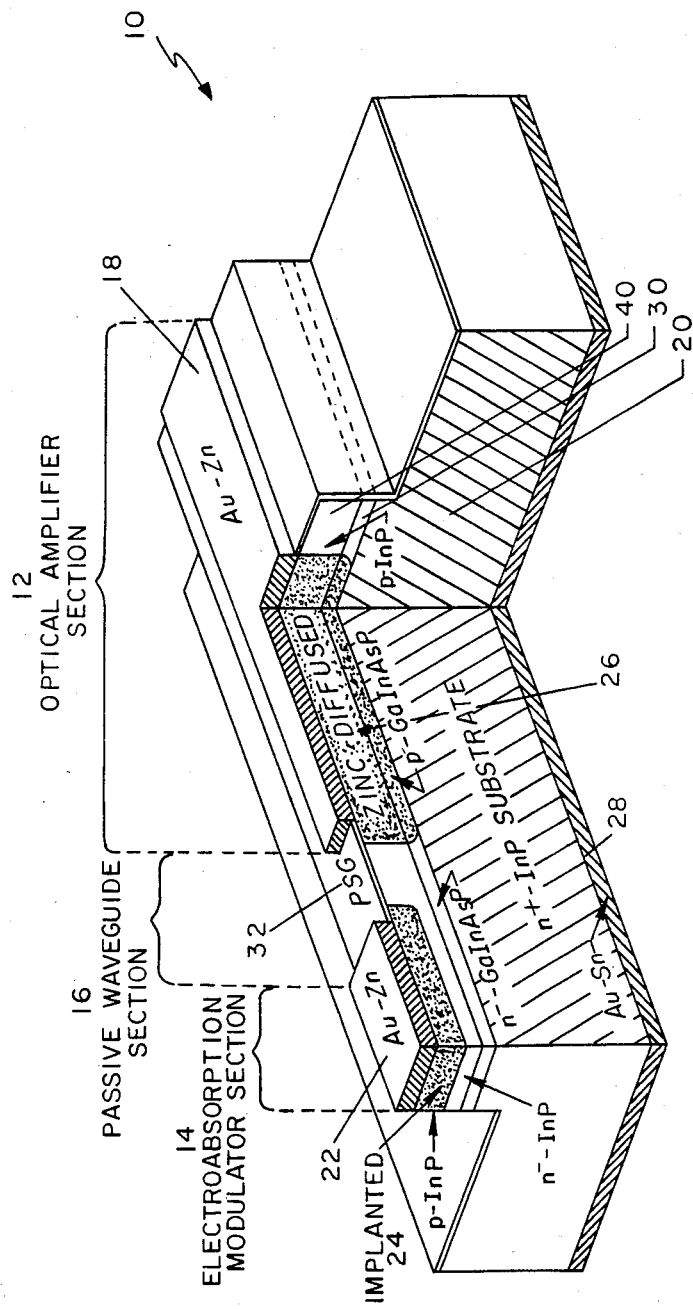

INTRA-CAVITY LOSS-MODULATED DIODE LASER

The government has rights in this invention pursuant to Air Force Contract No.: AF19 (628) 80-C-0002.

This application is a continuation of application Ser. No. 344,144, filed Jan. 29, 1982, now abandoned.

TECHNICAL FIELD

This invention relates to diode lasers, particularly actively Q-switched diode lasers having a modulator within the semiconductor cavity.

BACKGROUND OF THE INVENTION

Attention is directed to article by the inventors and their colleagues entitled "Intracavity loss modulation of Ga-In-As-P diode lasers" 38 *Applied Physics Letter* 120 (February 1981) and an abstract of the same title at page 2192 of the *IEEE Transactions on Electron Devices,* Vol. 27, No. 11, (November 1980) describing some aspects of their work. The *Applied Physics Letters* article and a Sc.D. thesis by D. Z. Tsang, one of the inventors herein, entitled "Intracavity Loss Modulation of Ga-In-As-P Diode Lasers" (catalogued MIT Libraries, Aug. 19, 1981) are hereby incorporated by reference.

Diode lasers are characterized by their ability to lase as a result of an electrical bias applied to a P-N junction. Electron-hole pairs are formed in the junction region which recombine and emit light. Q-switching refers to a method of achieving high pulse rates and high peak power by storing energy in an amplifying medium and then dumping it by rapidly decreasing the intracavity loss to produce nearly simultaneous emissions throughout the medium.

Intracavity loss modulation has been used effectively for Q-switching many gas and solid-state laser systems. Although this technique is capable of producing short optical pulses, high peak powers, and high repetition rates in such systems, it has not been successfully applied to diode lasers. To vary the intracavity loss in diode lasers, the use of electrooptically switched and acousto-optically switched gratings has been proposed. See for example, T. Tsukada and C. L. Tang "Q-switching of Semiconductors" *IEEE J. Quantum Electron* QE13,37 (1977). However, such devices are not an effective way to produce Q-switching as they do not produce large changes in intracavity losses, in practice.

Intracavity losses in diode lasers have also been modulated by electroabsorption using special growth techniques to produce a tapered active region thickness and varying material composition. See, for example. F. K. Reinhart and R. A. Logan "Monolithically integrated Al-Ga-As double heterostructure optical components" *Applied Physics Letters* 27 (10), 622 (1974). These devices had limited losses, could not be operated at high modulation rates, and were difficult to fabricate.

There exists a need for a diode laser capable of being Q-switched at high frequencies by an electroabsorptive loss modulator to produce high peak power and serve, for example, as a source for optical communications data bit streams. Preferably, the diode laser should be operable at frequencies up to 2.5 gigahertz or higher and be easily fabricated without special growth techniques.

SUMMARY OF THE INVENTION

We have discovered that a simple, intracavity loss modulated diode laser, suitable for Q-switched operation, can be made from a conventional heterostructure semiconductor wafer by doping and ion implantation.

Our diode laser is fabricated from a double heterostructure wafer consisting of a binary substrate, an active layer and a binary cap. The cleaved edges of the wafer form the resonating ends of the laser cavity. An amplifying laser section is formed in a portion of the active layer by diffusing a dopant through the cap and active layers. A loss-modulating section is formed by implanting ions into another section of the wafer through only a portion of the cap. The amplifying section and the loss modulating section are electrically isolated by a passive waveguide section of the active layer. Metalized contacts are provided for the amplifier and modulator sections and the substrate. Mesa etching may be used to provide lateral optical confinement.

Loss modulation takes place in the active layer when a reverse bias is applied to the pn junction formed by the implanted ions. In order that electroabsorption at zero bias does not occur, the depletion layer in the modulator section should not extend into the quaternary active region. The modulator is, therefore, designed with the junction in the binary cap layer, such that the zero-bias depletion region is entirely in the cap layer.

Our invention will now be described in connection with the preferred embodiment. However, it should be obvious to those skilled in the art that various changes may be made without departing from the spirit or scope of our claims. For examples, changes may be made in the semiconductor materials, dopants or implanted ions as well as device dimensions, electrical voltages, or drive signals and still be encompassed by the teachings herein. Moreover, while our modulator section was formed by beryllium implantation, other techniques such as cadmium diffusion can also be used. Additionally, while our amplifier section was formed by a diffused stripe, other techniques such as buried heterostructures and transverse junction strips may also be employed.

BRIEF DESCRIPTION OF THE FIGURE

The sole FIGURE is a partial cross-sectional, isometric, schematic view of our diode laser.

DETAILED DESCRIPTION OF THE PREFERRED EMBODIMENT

As shown in the sole FIGURE, our device 10 is formed from a double heterostructure wafer consisting of an n+ In-P substrate 20, an n− quaternary Ga-In-As-P layer 30 and an n− In-P cap layer 40. The device consists of an amplifier section 12 formed by diffusing zinc 26 through the cap 40 and into the quaternary layer 30; a modulator section 14 formed by implanting beryllium ions 24 into the surface of cap 40; and a passive waveguide section 16 covered by a PSG mask 32. Metallized contact 18 is connected to the amplifier section 12. Contact 22 is connected to the modulator 14 and a third contact 28 is connected to the substrate 20.

The amplifier section 12 consists of a conventional zinc-diffused double heterostructure bounded by the waveguide section 16 at one end and a mirror facet at the other. With a 10–12 μm stripe and a 200 μm amplifier length, the design is similar to the dimensions of a conventional zinc-diffused Ga-In-As-P diode laser.

The modulator and amplifier sections must be electrically isolated in order to properly bias each section. This function is served by the addition of the n-type passive waveguide section as shown in the sole FIGURE. The reverse bias on the modulator will take care of electrical isolation by providing a reverse-biased junction between the components. For effective isolation, the waveguide should be longer than the sum of the modulator depletion width, the diffusion length of carriers injected from the amplifier section, and the width of any strain-enhanced lateral diffusion of zinc at the PSG-IN-P interface. For a $10^{16}$ cm$^{-3}$ material, a 25 $\mu$m-long passive waveguide section was deemed adequate for electrical isolation of the amplifier and modulator. The modulator section can be operated with a reverse bias voltage from about one volt to about twenty volts and with a continuous modulation rate from about one gigahertz to about ten gigahertz.

The device 10 was grown by liquid-phase epitaxy (LPE) on a (100) oriented In-P (Sn) substrate 20 doped to $2 \times 10^-$cm$^{-3}$. The step cooling technique was used to grow a 0.2 $\mu$m thick active layer 30 $Ga_{0.23}In_{0.77}As_{0.52}P_{0.48}$ and an In-P cap layer 40. The net donor concentration in both layers was $10^{16}$ cm$^{-3}$ or lower. A buffer layer was not needed because an atmosphere of $PH_3$ in $H_2$ was used to prevent thermal etching prior to growth.

The thickness of the In-P cap layer ranged from 1.2 to 1.8 $\mu$m. Most of the epilayer was between 1.4 and 1.7 $\mu$m thick.

Alignment marks were etched into the wafer by etching the alignment pattern into PSG deposited on the surface. The PSG is etched with buffered HF while a 1% Br-methanol solution is used to etch the alignment marks.

Zinc was diffused through 10 to 12 $\mu$m windows in a PSG mask to form a p-n junction for the amplifier section. Each window was 400 $\mu$m long to form two "end-to-end" amplifier sections.

Beryllium ions were selectively implanted into the In-P cap in a section 25 $\mu$m wide by 100 $\mu$m long, to form two "end-to-end" modulators. Ion implantation was chosen over zinc diffusion for better control of the implanted profile. The implant was annealed at 700° C. for 10 min with a PSG cap layer in a flowing atmosphere of $PH_3$ and $N_2$.

The In-P and Ga-In-As-P epitaxial layers were masked and etched to leave a mesa 25 $\mu$m wide for lateral optical confinement in the waveguide and modulator section.

A final PSG insulator layer was deposited on the sample. Contact windows were opened in the PSG. Plated Au-Zn contacts were microalloyed to the Zn-diffused and Be-implanted regions. After the wafer was lapped to a thickness of 75 $\mu$m, an evaporated or plated Au-Sn contact was microalloyed to the n+ In-P substrate.

Sputtered Ti and Au were photolithographically defined to form contact pads on the p-side. The devices were cleaved to form mirror facets. The individual devices were then cut apart with a high speed dicing saw.

Laser threshold currents of 260-300 mA with the modulator open-circuited were typical. The pulsed threshold increased by a factor of about 2.9 upon application of a 20-V reverse bias. The lasers were operated at repetition frequencies between 1.7 and 4.0 GHz by application of a cw microwave signal to the modulator and an electrical excitation to the amplifier.

A few comments should be made comparing intracavity, loss-modulated diode lasers and current modulated lasers. A diode laser with an intracavity loss modulator can be operated with the amplifier section pumped harder than a conventional current-modulated laser which is prebiased below threshold. In general terms, the higher average current injection rate tends to increase the spontaneous emission rate into the mode and increase the optical gain. Therefore, the photon density tends to build up faster, from a higher initial value of the spontaneous flux relative to a current-modulated laser. In addition, it may be possible to operate the device in a mode where some, but not all, of the electrons are dumped each time the modulator loss is lowered. Since there is always some population inversion under such conditions, the charge build up time can be eliminated. In contrast to current-modulated lasers which have a relatively high capacitance, this laser can be modulated with a low-capacitance reverse-biased modulator. The capacitance of the modulators can be 0.5-1 pF or less, values sufficiently low that the modulation frequency will not be limited by capacitance. Another advantage of intracavity loss modulation is that the laser output can be taken from the modulator end. Since the modulator attenuates the spontaneous emission, the depth of the modulation can be greater than with current modulated lasers.

In summary, diode lasers with an intracavity electroabsorption modulator have been fabricated without the use of special growth techniques, and large depth of modulation has been achieved at frequencies up to 4.0 GHz.

What we claim is:

1. In an amplitude modulated diode laser comprising a double heterostructure having a substrate, an active layer and a cap layer, an improved heterostructure comprising:
   (a) an amplifier section comprising a doped portion of the active layer and a diode junction between the active layer and the substrate;
   (b) bias means for exciting the amplifier section;
   (c) a loss modulating section comprising a shallow ion-implanted portion of the cap layer and a second diode junction formed in the cap layer electrically isolated and physically remote from the active layer but capable of influencing the active layer when the second junction is reverse biased;
   (d) means for modulating the losses in the modulator section, the modulating means comprising
      (i) means for applying a reverse bias voltage to the second junction; and
      (ii) means for superimposing a modulating electric waveform upon the reverse bias voltage; and
   (e) a passive waveguide section located in the active layer between the amplifying and modulating sections and having low dopant concentration and sufficient length to electrically isolate the amplifying and modulating sections from each other, the heterostructure having cleaved ends with mirror facets defining a laser resonating cavity therebetween.

2. The heterostructure of claim 1 wherein the substrate is n+ InP, the active layer is n− GaInAsP, and the cap is n− InP.

3. The heterostructure of claim 2 wherein further the dopant is zinc and the ions are beryllium.

4. The heterostructure of claim 1 wherein the means for exciting the amplifier section is electrical.

5. The heterostructure of claim 1 wherein the means to modulate the modulator section is a reverse bias voltage from about one to about 20 volts.

6. The heterostructure of claim 1 wherein the means for modulating losses is a continuous wave electrical source operating at a modulation rate from about 1 Hz to about 10 GHz.

* * * * *